(12) United States Patent  
Van Deursen et al.

(10) Patent No.: US 7,224,159 B2
(45) Date of Patent: May 29, 2007

(54) FOLDABLE MULTIMETER

(75) Inventors: Gary E Van Deursen, Avon, CT (US); Vince A Cook, Milford, CT (US)

(73) Assignee: The Stanley Works, New Britain, CT (US)

(*) Notice: Subject to any disclaimer, the term of this patent is extended or adjusted under 35 U.S.C. 154(b) by 258 days.

(21) Appl. No.: 10/459,705

(22) Filed: Jun. 12, 2003

(65) Prior Publication Data

US 2004/0012379 A1    Jan. 22, 2004

Related U.S. Application Data

(60) Provisional application No. 60/387,573, filed on Jun. 12, 2002, provisional application No. 60/387,566, filed on Jun. 12, 2002.

(51) Int. Cl.
*G01R 1/04* (2006.01)
(52) U.S. Cl. ........................................ 324/156; D10/78
(58) Field of Classification Search ............... 324/72.5, 324/99 D, 103 R, 103 P, 110, 114–116, 122, 324/129, 133, 144, 149, 156; 310/314, 339; 379/21; 73/431; D10/75–80, 122–132
See application file for complete search history.

(56) References Cited

U.S. PATENT DOCUMENTS

| D236,442 | S | | 8/1975 | Steele |
| D241,726 | S | | 10/1976 | D'Antonio |
| D268,172 | S | | 3/1983 | Chirkov |
| 4,439,726 | A | * | 3/1984 | Hochreuther et al. ....... 324/156 |
| 4,476,721 | A | | 10/1984 | Hochreuther et al. |
| 4,940,204 | A | * | 7/1990 | Nelson et al. .............. 248/688 |
| 5,481,185 | A | * | 1/1996 | Lane et al. ................. 324/145 |
| 5,543,707 | A | * | 8/1996 | Yoneyama et al. ......... 324/115 |
| 5,629,615 | A | | 5/1997 | Nita et al. |
| D412,294 | S | * | 7/1999 | Kaise et al. ................. D10/78 |
| 5,920,188 | A | * | 7/1999 | Voorheis et al. ............ 324/110 |
| D414,709 | S | | 10/1999 | Arnoux et al. |
| D419,466 | S | | 1/2000 | McCain |
| D435,796 | S | | 1/2001 | Tomiyama et al. |
| 6,218,824 | B1 | * | 4/2001 | Oldstead et al. ............ 324/115 |

FOREIGN PATENT DOCUMENTS

DE    2636079 A * 2/1978

OTHER PUBLICATIONS

Kaito Electronics Inc Meter Professional, YX360TRD, http://web.archive.org/web/20010524140829/http://home.earthlink.net/~kaito/yx360trd.htm, 1 page, May 24, 2001.*
Wayback Machine page disclosing the date of publication of Kaito Electronics Inc Meter Professional, YX360TRD, http://web.archive.org/web/*/http://home.earthlink.net/~kaito/yx360trd.htm, 1 page.*

* cited by examiner

*Primary Examiner*—Edward Lefkowitz
*Assistant Examiner*—David M. Schindler
(74) *Attorney, Agent, or Firm*—Pillsbury Winthrop Shaw Pittman LLP (57) ABSTRACT

A multimeter includes a body portion, a cover pivotally connected to the frame such that the cover is selectively moveable about a rotational axis between an open position and a closed position, and a probe assembly including a pair of measuring lines connectable to the frame. The cover includes a magnetic portion on an exterior surface thereof that is configured and positioned to magnetically mount the body portion for use in an inclined relation to a metal surface when the cover is in the open position, and to magnetically mount the body portion to a metal surface when in the closed position.

25 Claims, 12 Drawing Sheets

FOLDABLE MULTIMETER

The present application claims priority to U.S. Provisional Applications of Van Deursen et al., Ser. Nos. 60/387,566 and 60/387,573, the entireties of both being hereby incorporated into the present application by reference.

FIELD OF THE INVENTION

The present invention relates to multimeters.

BACKGROUND AND SUMMARY OF THE INVENTION

Multimeters are well known devices. It has been proposed in the expired art to provide a folding multimeter for more convenient handling. Specifically, see U.S. Pat. No. 4,439,726. This patent discloses an arrangement in which the two housings 1a, 2a are pivotally connected to rotate about an axis. However, the arrangement lacks structure for accommodating the measuring lines of the multimeter, which tend to be in disarray.

It is an object of the present invention to overcome the deficiencies noted above in the prior art. In accordance with the principles of the present invention, this objective is achieved by providing a multimeter including a frame, a cover pivotally connected to the frame such that the cover is selectively moveable about a rotational axis between an open position and a closed position, and a probe assembly including a pair of measuring lines connectable to the frame. Opposing edges of the frame have a concave portion for receiving the measuring lines.

Another aspect of the present invention relates to a multimeter including a first frame portion, a second frame portion, an intermediate frame portion, and a probe assembly. The intermediate frame portion is pivotally connected to the first frame portion and the second frame portion such that the first frame portion and the second frame portion are selectively moveable about first and second rotational axes, respectively, between an open position and a closed position. The probe assembly includes a pair of measuring lines. The first frame portion and the second frame portion cooperate to form a measuring line receiving space around the periphery thereof when the first frame portion and the second frame portion are in the closed position.

These and other objects, features, and advantages of this invention will become apparent from the following detailed description when taken into conjunction with the accompanying drawings, which are a part of this disclosure and which illustrate, by way of example, the principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
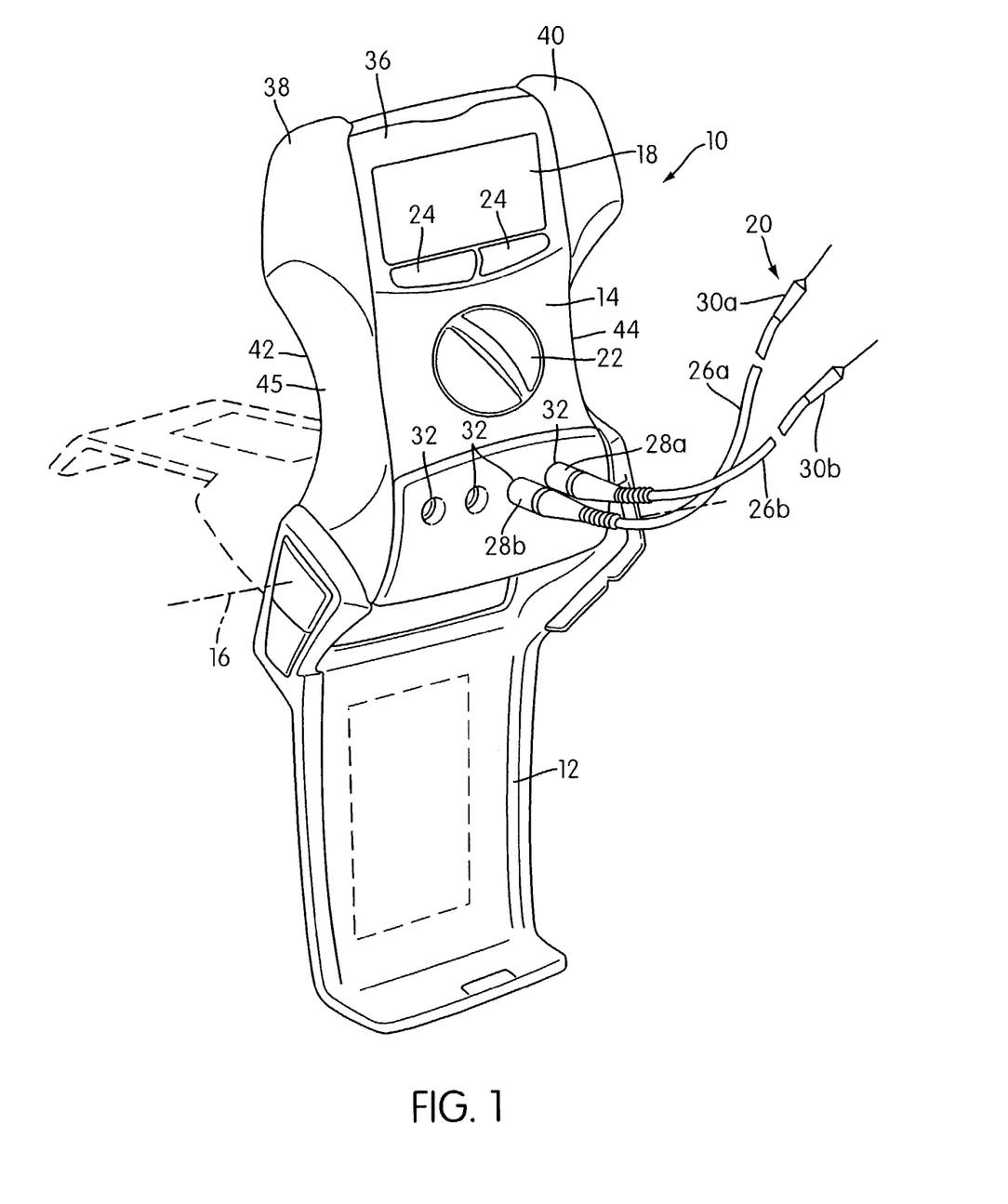
FIG. 1 is a perspective view of an embodiment of a foldable multimeter in the open position.
Figure 2:
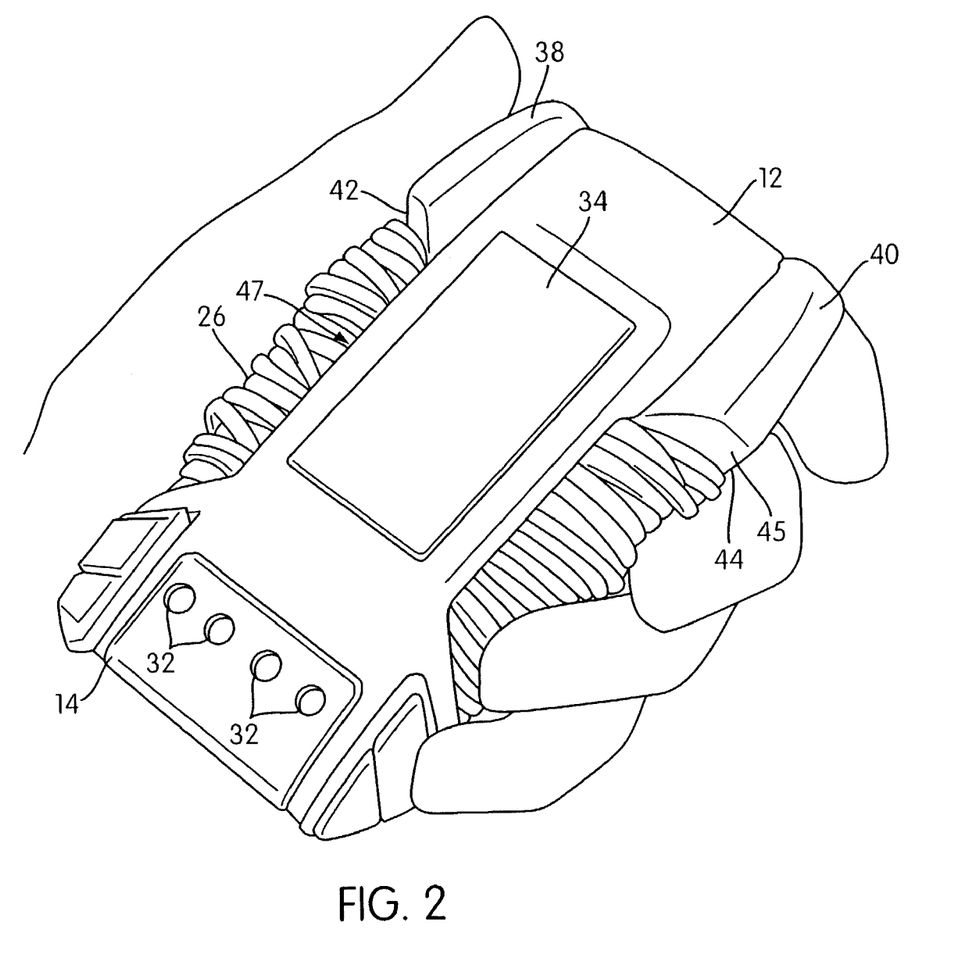
FIG. 2 is a perspective view of the foldable multimeter shown in FIG. 1 in the closed position.

Referring now more particularly to FIGS. 1 and 2, there is shown therein a handheld foldable multimeter 10, which embodies the principles of the present invention. As is well known in the art, the multimeter 10 is constructed and arranged to read and measure the values of several different electrical parameters such as current, voltage, and resistance.

In the illustrated embodiment, the multimeter 10 includes a cover 12 pivotally connected to a single body frame or body portion 14 for selective movement about a rotational axis 16. As a result of this pivotal connection, the cover 12 may be moved relative to the frame 14 between an open position, as shown in FIG. 1, and a closed position, as shown in FIG. 2.

As shown in FIG. 1, the frame 14 includes a face carrying a liquid crystal display (LCD) 18 for displaying a digital output value measured by a probe assembly 20 of the multimeter 10. The output value may include the unit of measurement. The frame 14 also includes a rotatable operating knob 22 that is selectively moveable to several positions that correspond to operating ranges. The user must select which operating range is appropriate for the measurement the user wants to make. Several operating buttons 24, as conventionally provided with multimeters, are provided on the frame 14 adjacent the LCD 18.

The probe assembly 20 includes two measuring lines 26a, 26b. Each measuring line 26a, 26b includes an input end 28a, 28b and a measuring probe 30a, 30b, respectively. The input ends 28a, 28b are electrically connected with input jacks 32 provided on the front face of the frame 14. In the illustrated embodiment, the frame 14 includes four input jacks 32. The input jacks 32 are preferably positioned adjacent the lower edge of the frame 14 so that the measuring lines 26a, 26b do not need to be removed when the cover 12 is folded to the closed position. The measuring lines 26a, 26b can be wrapped around an intermediate portion of the frame 14 prior to moving the cover 12 to the closed position, as will be further discussed.

When the cover 12 is in its open position, this allows the user to view the LCD display 18, adjust the operating knob 22, and utilize the operating buttons 24. The operating knob 22 is adjustable such that the multimeter 10 can read and measure AC voltage, DC voltage, current, and resistance, for example. The operating knob 22 may also be adjustable such that the multimeter 10 can perform a continuity check. The operating buttons 24 may include a power button, a hold button, a range button, and a function button. The cover 12 is moved to the closed position, which is in covering relation to the LCD display 18 and operating knob/buttons 22, 24, to protect the LCD display 18 and operating knob/buttons 22, 24. The buttons or knobs can generally be referred to as input mechanisms.

The cover 12 is pivotally connected to the frame 14 so as to enable a position of the cover 12 relative to the frame 14 to be selectively adjusted. The friction between the frame 14 and the cover 12 provides sufficient resistance to movement relative to one another such that a secure position can be maintained during operation of the multimeter 10. Thus, the cover 12 may be moved to the open position shown in FIG. 1 in dashed lines to function as a stand. Specifically, the cover 12 is capable of retaining an angular relationship relative to the frame 14 when in the open position thereof so as to present the face of the frame 14 in an inclined relation relative to a horizontal surface when the cover 12 is placed on such horizontal surface.

Further, the cover 12 has a magnetic portion 34 (shown in FIG. 2) on an exterior surface thereof such that when the cover 12 is moved to the open position shown in FIG. 1 in solid lines, the multimeter 10 may be mounted when in use on a metallic surface by the magnetic portion 34 provided on the cover 12. The magnetic portion 34 also permits mounting of the multimeter 10 on a metallic surface when the multimeter 10 is in the folded or closed position, as shown in FIG. 2.

The main body 36 of the frame 14 is made from a hard plastic based material, such as PVC. As illustrated, opposing edges 38, 40 of the frame 14 are preferably overmolded with a higher friction material, such as high coefficient of friction plastic or a rubber based material, to enhance the grip of the multimeter 10 and provide some impact protection.

Further, opposing edges 38, 40 of the frame 14 have a concave portion 42, 44, respectively, for receiving the measuring lines 26a, 26b when the multimeter 10 is not in use. When the cover 12 is in the open position, the measuring lines 26a, 26b can be wrapped around the frame 14 within the concave portions 42, 44. The measuring probes 30a, 30b may be secured within openings provided in the periphery of the frame 14 or simply secured under the wrapped measuring lines 26a, 26b. After the measuring lines 26a, 26b are wrapped around the frame 14, the cover 12 is moved to the closed position to securely hold the measuring lines 26a, 26b in place. The cover 12 can be secured to the frame 14 in the closed position with a snap fit.

More specifically, the frame 14 has a narrowed body portion 45, the cover 12 cooperating with the narrowed body portion 45 so as to define a measuring line receiving space 47 between the front face of the frame 14 and the cover 12 when the cover 12 is in covering relation to the display and input mechanisms to enable the measuring lines 26a, 26b to be wrapped around the narrowed body portion 45 and through the measuring line receiving space 47 between the front face of the frame 14 and the cover 12.

Figure 3:
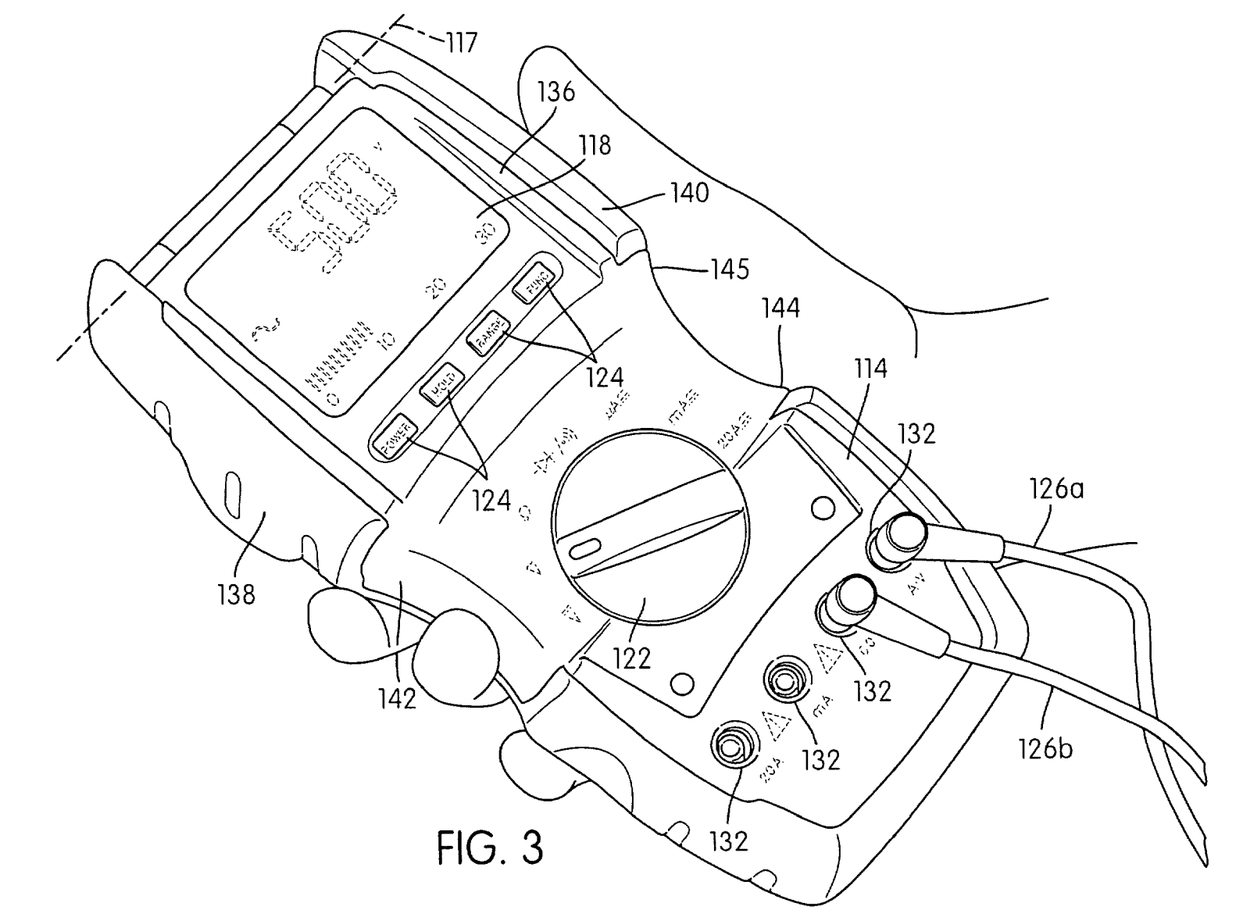
FIG. 3 is a perspective view of another embodiment of a foldable multimeter in the open position.
Figure 4:
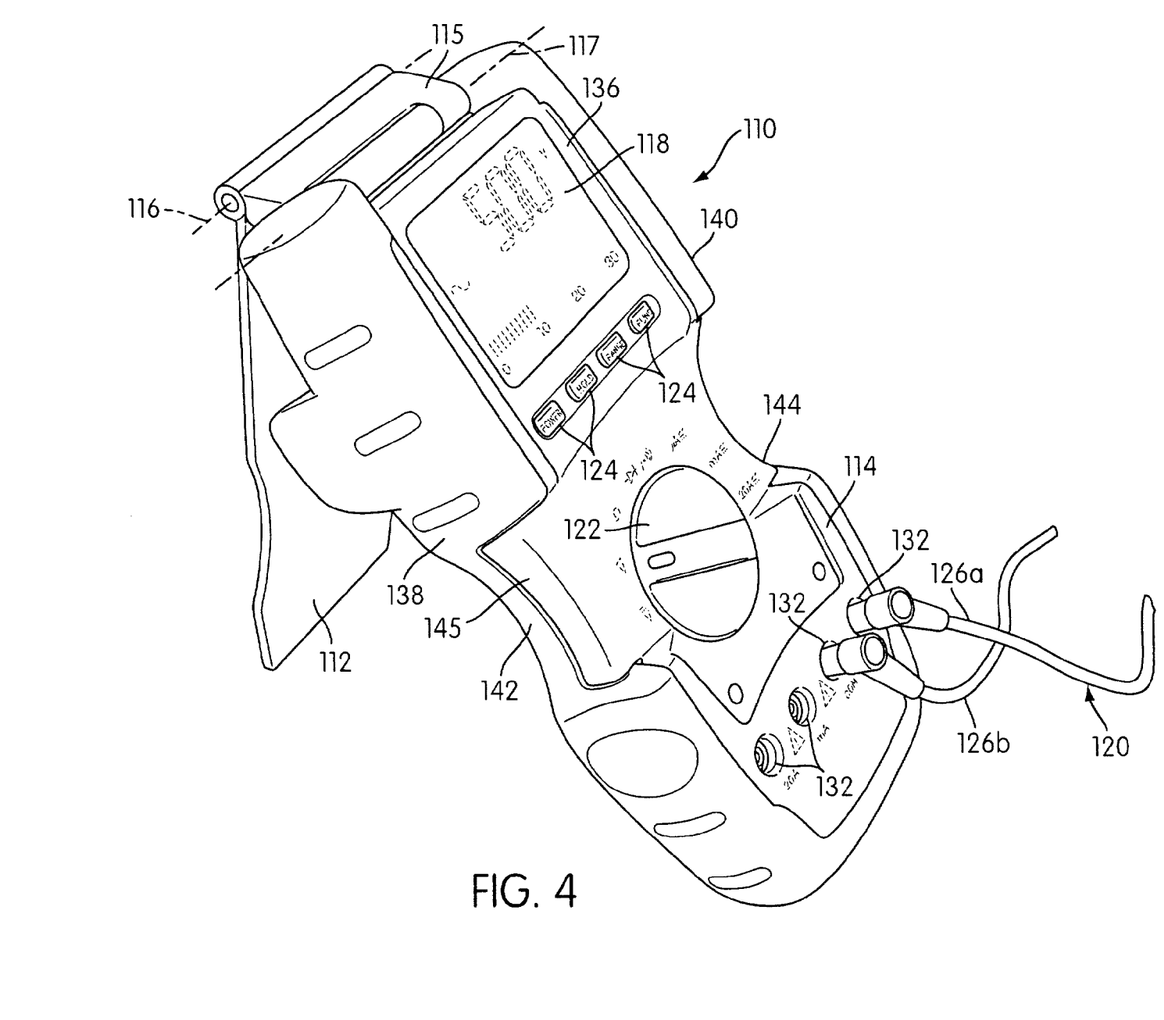
FIG. 4 is a perspective of the foldable multimeter shown in FIG. 3 in the open position with the cover acting as a stand.

FIGS. 3–10 illustrate another embodiment of the multimeter. As illustrated, the multimeter 110 includes a cover 112 pivotally connected to a single body frame or body portion 114. Specifically, as shown in FIG. 4, the cover 112 includes a mounting member 115 pivotally connected to the frame 114 and the cover 112 is pivotally connected to the mounting member 115. As a result, the cover 112 is pivotable about a rotational axis 116 and the mounting member 115 is pivotable about rotational axis 117. As a result of this pivotal connection, the cover 112 may be moved relative to the frame 114 between an open position, as shown in FIGS. 3, 4, 6, and 10, and a closed position, as shown in FIG. 5 and 7–9.

Similar to the embodiment described above, the frame 114 includes an LCD display 118, an operating knob 122, and operating buttons 124. Input jacks 132 for the measuring lines 126a, 126b of the probe assembly 120 are provided on the front face of the frame 114. As illustrated, the input jacks 132 include jacks for varying magnitudes of current, a voltage jack, and a common jack (e.g., ground or neutral).

When the cover 112 is in its open position, this allows the user to view the LCD display 118, adjust the operating knob 122, and utilize the operating buttons 124. As illustrated, the LCD 118 displays a digital output value with the unit of measurement (e.g., 500 V) measured by a probe assembly 120 of the multimeter 110. The LCD 118 also indicates the electrical parameter it is measuring (e.g., ~for AC voltage). The operating knob 122 is adjustable such that the multimeter 110 can read and measure AC voltage, DC voltage, resistance, and varying magnitudes of current, for example. The operating knob 122 is also adjustable such that the multimeter 110 can perform a continuity check. The operating buttons 214 include a power button, a hold button for maintaining a measurement on the LCD 118, a range button, and a function button. The cover 112 is moved to the closed position to protect the LCD display 18 and operating knob/buttons 122, 124.

Figure 10:
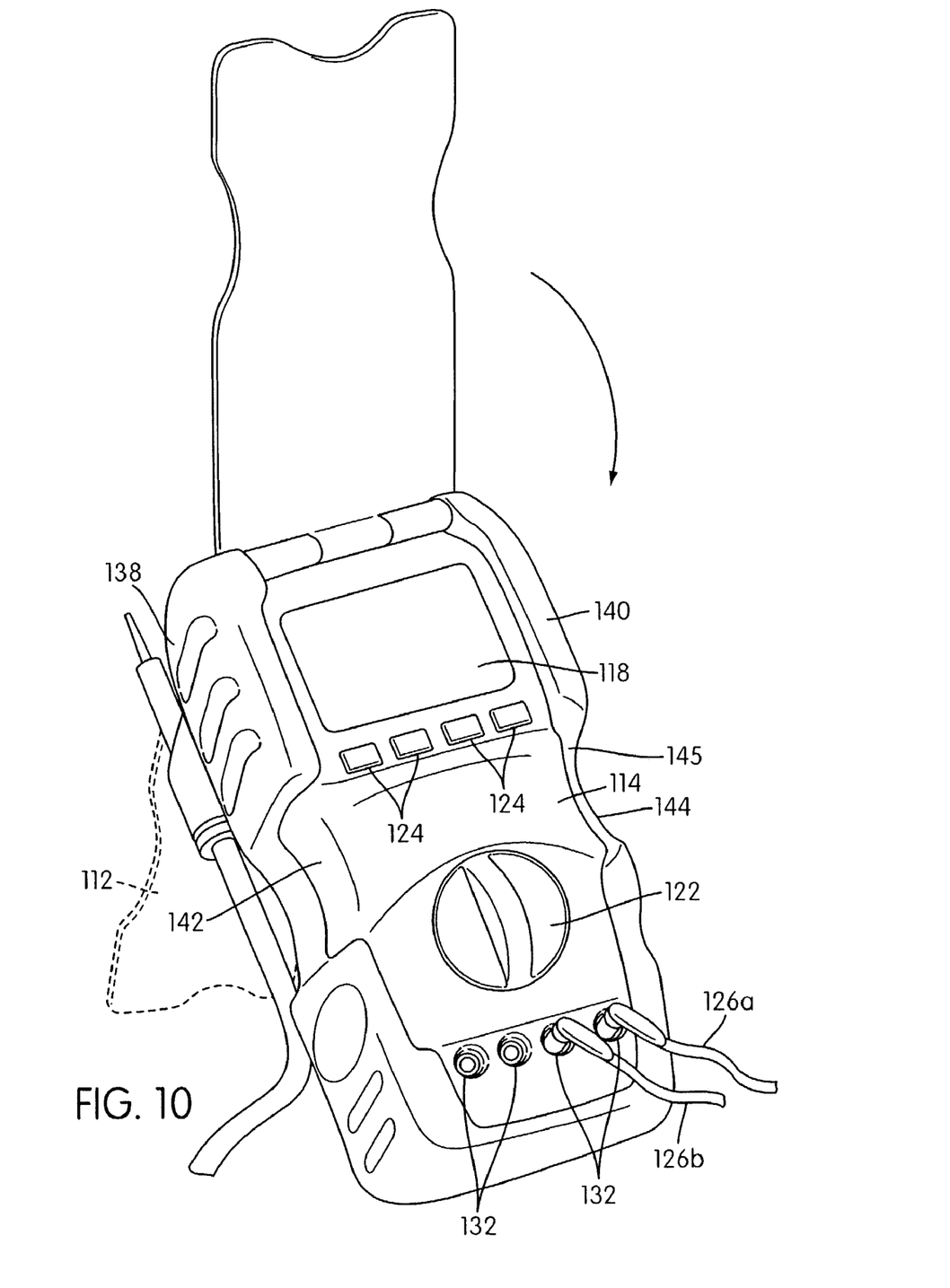
FIG. 10 is a perspective of the foldable multimeter shown in FIG. 3 in the open position with the cover acting as a stand.

The cover 112 is pivotally connected to the frame 114 so that the cover 112 can be moved to the open position shown in FIGS. 4 and 10 to function as a stand. Specifically, the cover 112 is capable of retaining an angular relationship relative to the frame 114 when in the open position thereof so as to present the face of the frame 114 in an inclined relation relative to a horizontal surface when the cover 112 is placed on such horizontal surface. The cover 112 can also be moved to the open position shown in FIG. 3 wherein the cover 112 is adjacent the back of the frame 114 so as to facilitate handling.

The main body 136 of the frame 114 is made from a hard plastic based material, such as PVC. As illustrated, opposing edges 138, 140 of the frame 114 are preferably overmolded with a higher friction material, such as high coefficient of friction plastic or a rubber based material, to enhance the grip of the multimeter 110 and provide some impact protection.

Figure 5:
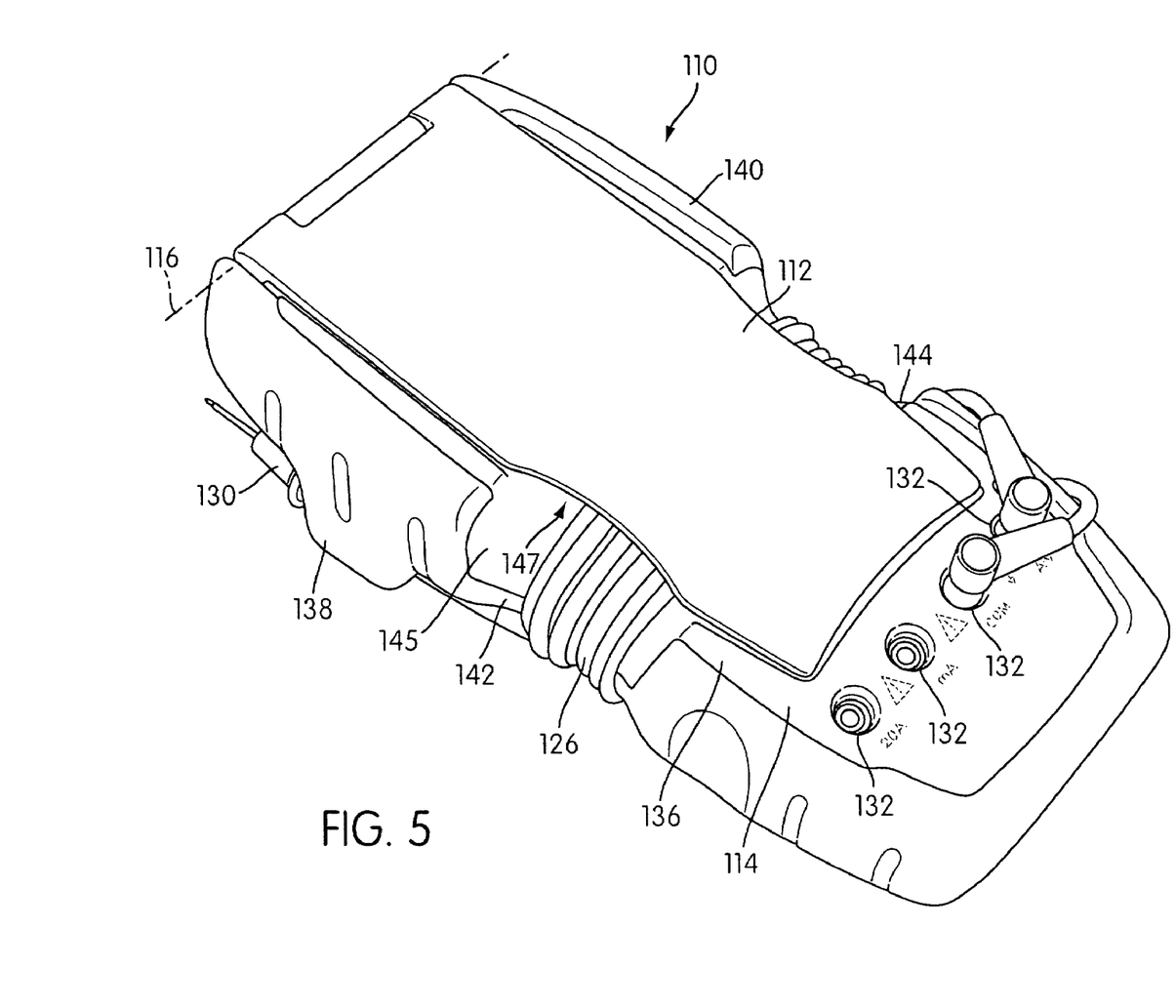
FIG. 5 is a perspective view of the foldable multimeter shown in FIG. 3 in the closed position.
Figure 6:
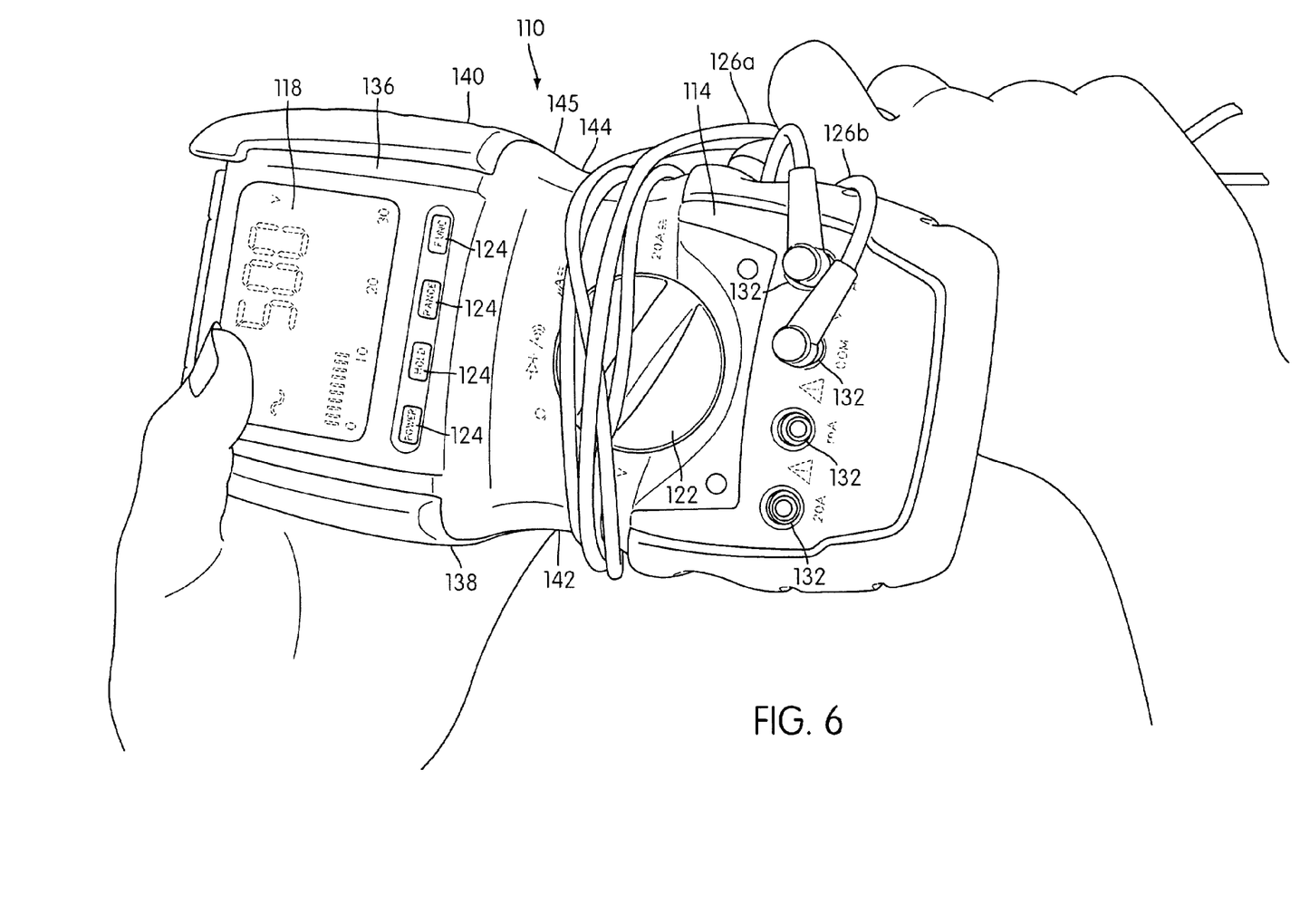
FIG. 6 is a perspective of the foldable multimeter shown in FIG. 3 in the open position with the measuring lines of the probe assembly being wrapped around an intermediate portion of the frame.
Figure 7:
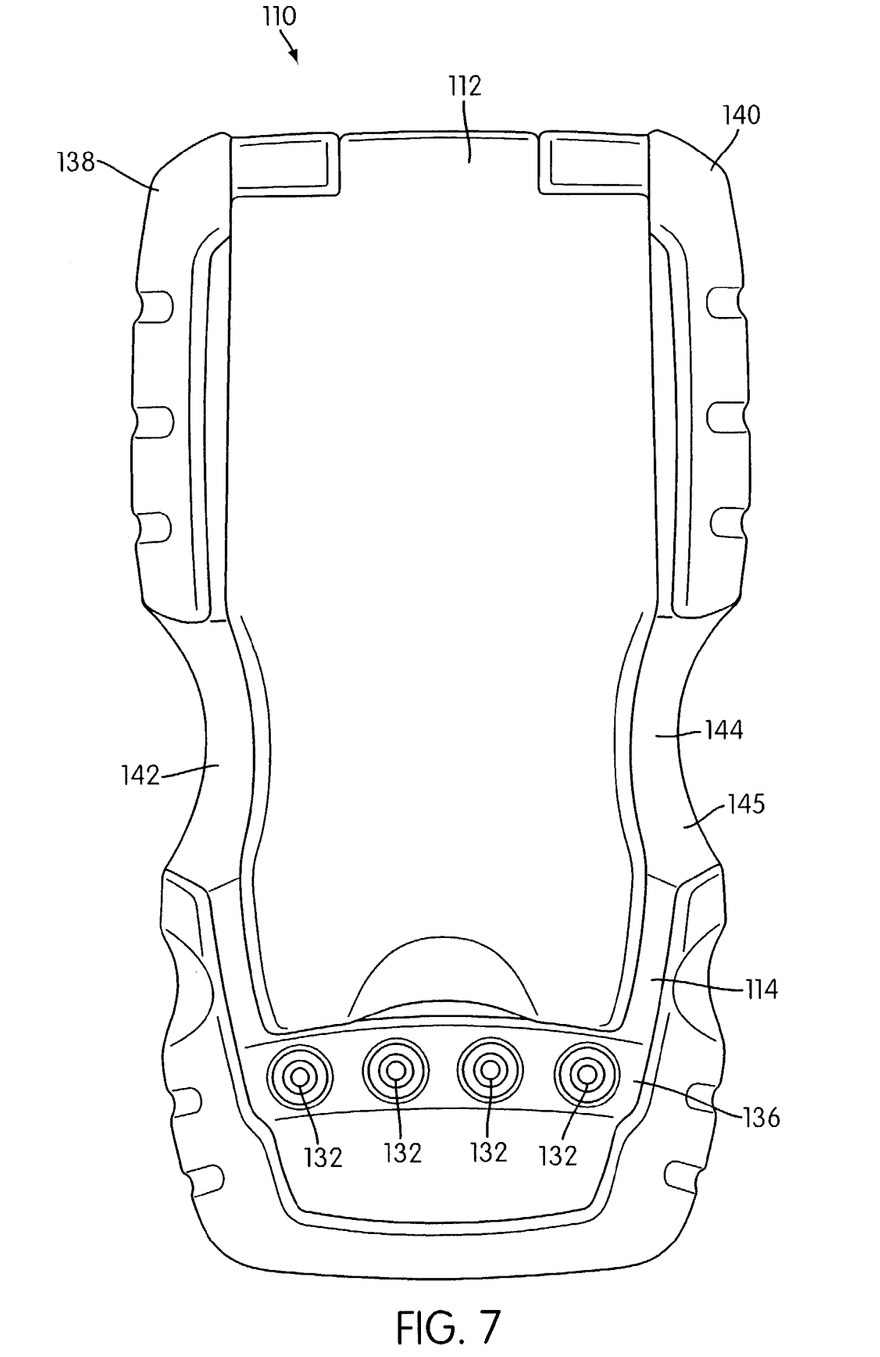
FIG. 7 is a top plan view of the foldable multimeter shown in FIG. 3 in the closed position.
Figure 8:
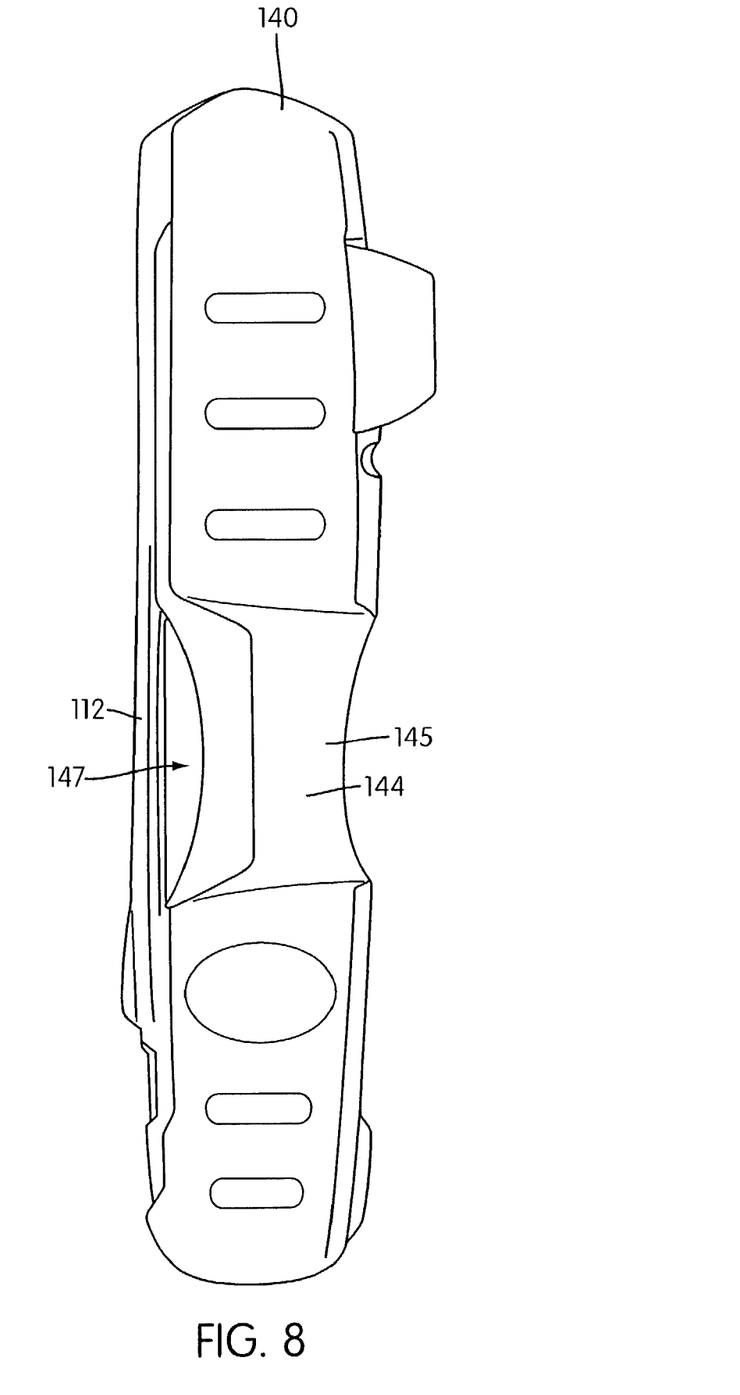
FIG. 8 is a side view of the foldable multimeter shown in FIG. 3 in the closed position.
Figure 9:
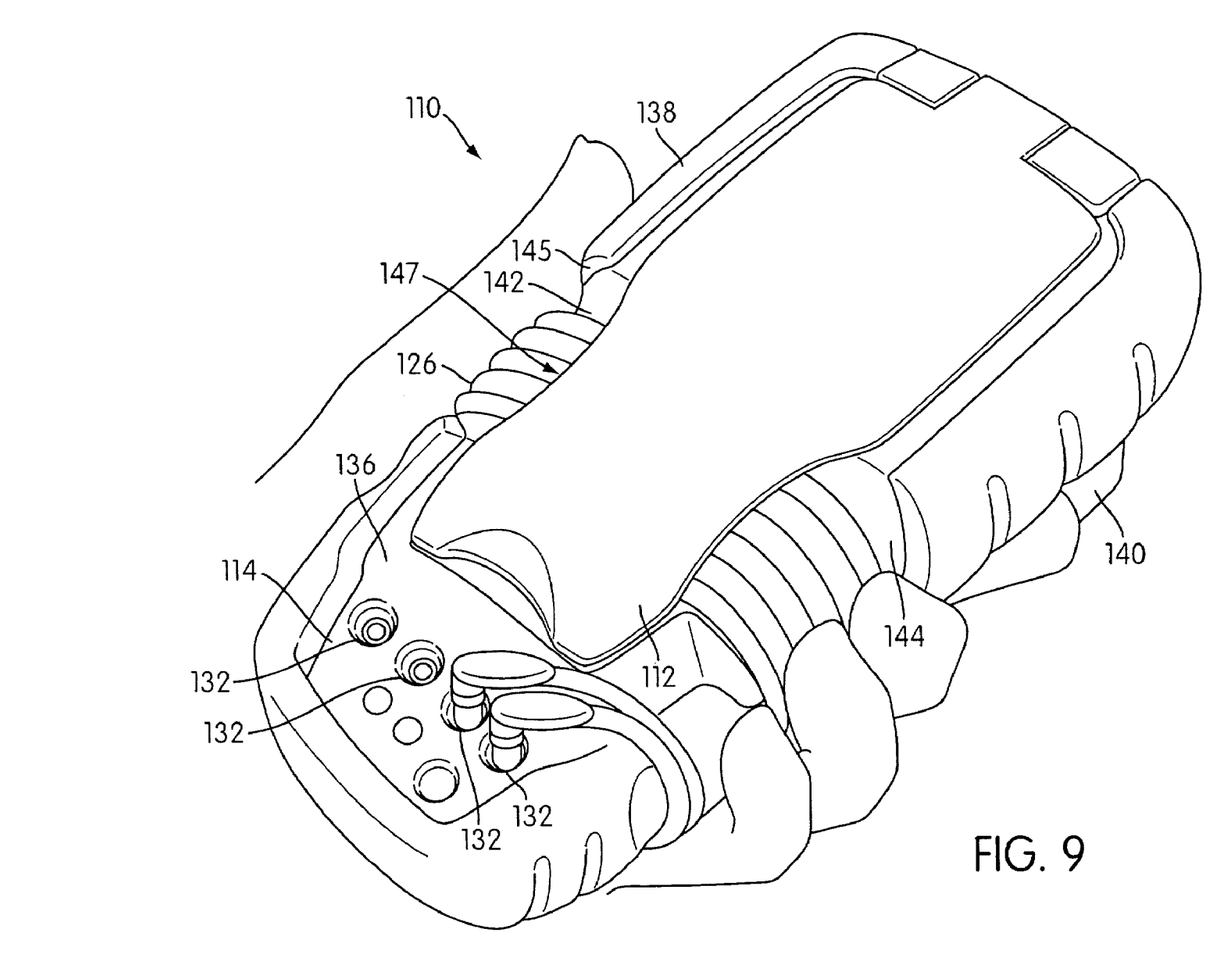
FIG. 9 is a perspective view of the foldable multimeter shown in FIG. 3 in the closed position.

Further, opposing edges 138, 140 of the frame 114 have concave portions 142, 144, respectively, for receiving the measuring lines 126a, 126b when the multimeter 110 is not in use. When the cover 112 is in the open position, the measuring lines 126a, 126b can be wrapped around the frame 114 within the concave portions 142, 144, as shown in FIG. 6. The measuring probes 130 (shown in FIG. 5) may be secured within openings provided in the periphery of the frame 114 or simply secured under the wrapped measuring lines 126a, 126b. As illustrated in FIG. 5, the measuring probes 130 are secured by a probe securing structure provided on the back of the frame 114. After the measuring lines 126a, 126b are wrapped around the frame 114, the cover 112 may be moved to the closed position to securely hold the measuring lines 126a, 126b in place, as shown in FIGS. 5 and 9. The cover 112 may be secured to the frame 114 in the closed position with a snap fit.

More specifically, the frame 114 has a narrowed body portion 145, the cover 112 cooperating with the narrowed body portion 145 so as to define a measuring line receiving space 147 between the front face of the frame 114 and the cover 112 when the cover 112 is in covering relation to the display and input mechanisms to enable the measuring lines 126a, 126b to be wrapped around the narrowed body portion 145 and through the measuring line receiving space 147 between the front face of the frame 114 and the cover 112.

The foldable configuration of the multimeter 10, 110 is advantageous because it allows the LCD display and operating knob/buttons to be protected from impact when the cover is in the closed position. The cover can also act as a stand when the cover is moved to an open position. Further, the frame is configured to receive the measuring lines when the multimeter is not in use.

Figure 11:
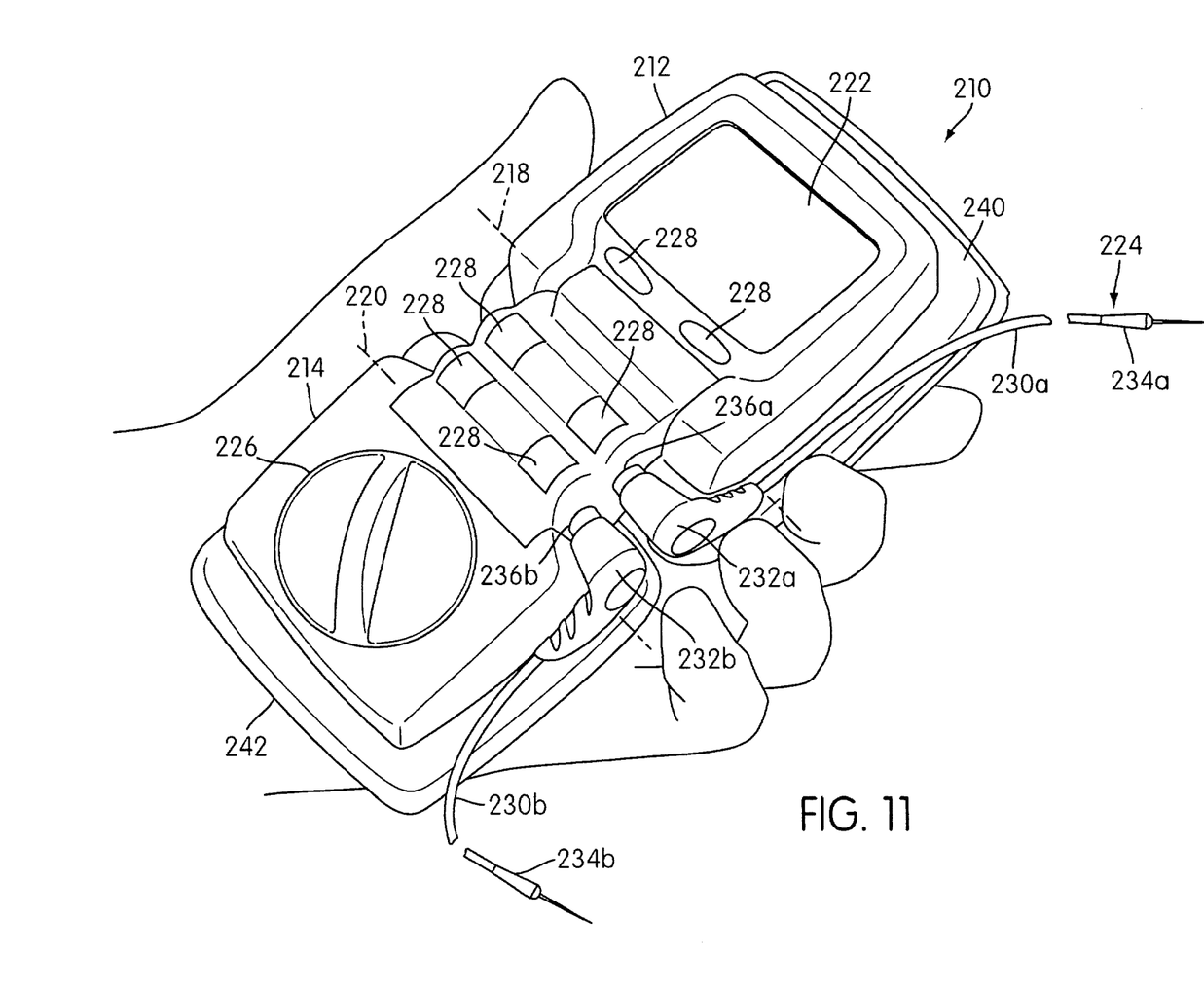
FIG. 11 is a perspective view of another embodiment of a foldable multimeter in the open position.
Figure 12:
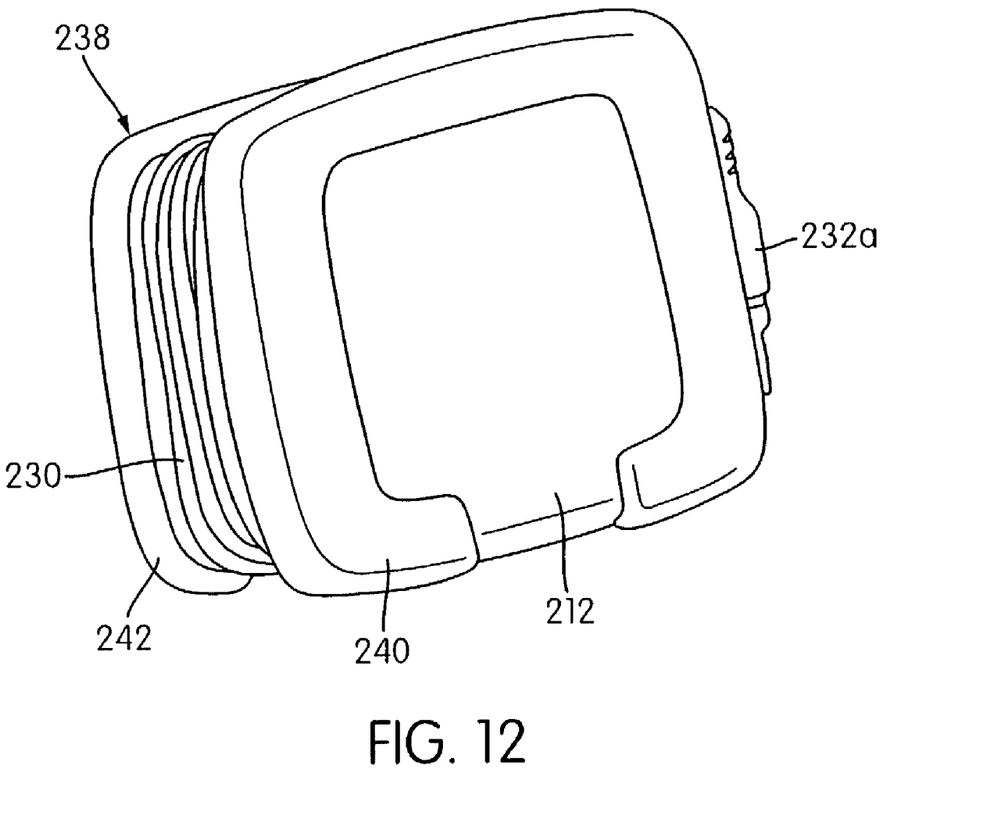
FIG. 12 is a perspective view of the foldable multimeter shown in FIG. 1 in the closed position.

FIGS. 11 and 12, illustrate another embodiment of a handheld foldable multimeter, indicated as 210.

In the illustrated embodiment, the multimeter 210 includes a body having a first body portion 212, a second body portion 214, and an intermediate body portion 216 that is pivotally connected to the first and second body portions 212, 214. Specifically, the first and second body portions 212, 214 are each pivotally connected to the intermediate body portion 216 for selective movement about first and second rotational axes 218, 220, respectively. As a result of this pivotal connection, the first and second body portions 212, 214 may be moved relative to one another between an open position, as shown in FIG. 11, and a closed position, as shown in FIG. 12. In other words, the first and second body portions 212, 214 are each configured to rotate between 0–90° relative to the intermediate body portion 216.

In an alternative embodiment, it is contemplated that the first body portion 212 may be pivotally connected directly to the second body portion 214, without an intermediate body portion 216.

As shown in FIG. 11, the first body portion 212 includes a liquid crystal display (LCD) 222 for displaying a digital output value measured by a probe assembly 224 of the multimeter 210. The output value may include the unit of measurement. The second body portion 214 includes a rotatable operating knob 226 that is selectively moveable to several positions that correspond to operating ranges. The user must select which operating range is appropriate for the measurement the user wants to make. Several operating buttons 228, as conventionally provided with multimeters, are provided on the intermediate body portion 216 as well as on the first body portion 212.

The probe assembly 224 includes two measuring lines 230a, 230b. Each measuring line 230a, 230b includes an input end 232a, 232b and a measuring probe 234a, 234b, respectively. The input ends 232a, 232b are electrically connected with input jacks 236a, 236b provided on one side of the intermediate body portion 216. The input jacks 236a, 236b are preferably connected to the side of the intermediate body portion 216 so that the measuring lines 230a, 230b do not need to be removed when the multimeter 210 is folded to the closed position. However, the input jacks 236a, 236b may be provided on the face surface of the first, second or intermediate body portions 212, 214, 216. Further, the intermediate body portion 216 has a smaller width than a width of the first and second body portions 212, 214. As a result, the input ends 232a, 232b of the measuring lines 230a, 230b do not protrude outwardly past the peripheral edges of the first and second body portions 212, 214 when the input ends 232a, 232b are inserted within the input jacks 236a, 236b. The measuring lines 230a, 230b can be wrapped around the periphery of the body when the multimeter 210 is in the closed position, as will be further discussed.

When the multimeter 210 is in its open position, this allows the user to view the LCD display 222, adjust the operating knob 226, and utilize the operating buttons 228. The operating knob 226 is adjustable such that the multimeter 210 can read and measure AC voltage, DC voltage, current, and resistance, for example. The operating knob may also be adjustable such that the multimeter 210 can perform a continuity check. The operating buttons 228 may include a power button, a hold button, a range button, and a function button. The multimeter 210 is moved to the more compact closed position for storage.

The first and second body portions 212, 214 are pivotally connected to the intermediate body portion 216 so as to enable a position of one of the body portions 212, 214 relative to the other body portion 212, 214 to be selectively adjusted. Thus, the LCD display 222 may be tilted to the desired angle for viewing. The friction between each of the first and second body portions 212, 214 and the intermediate body portion 216 provides sufficient resistance to movement relative to one another such that a secure position can be maintained during operation of the multimeter 210.

The main body portion of the first and second body portions 212, 214 are made from a hard plastic based material, such as PVC. As illustrated, the outer edges 240, 242 of the first and second body portions 212, 214 are preferably overmolded with a relatively higher friction material and relatively softer material in comparison with the main body portion, such as high coefficient of friction plastic or a rubber based material, to enhance the grip of the multimeter 210 and provide some impact protection. The overmolded peripheral portions 240, 242 also cooperate to define a peripheral channel or space about the periphery of the multimeter 210 when folded as shown in FIG. 12.

Thus, in the closed position, the first and second body portions 212, 214 lie flat on top of one another and cooperate to form a measuring line receiving space or channel 238, as shown in FIG. 12. The channel defined by peripheral edges 240, 242 of the first and second body portions 212, 214, respectively, define the measuring line receiving space 238 for receiving measuring lines 230 when the multimeter 210 is not in use. After the measuring lines 230 are wrapped around the body within the measuring line receiving space 238, the measuring probes 234a, 234b may be secured within openings provided in the periphery of the body or simply secured under the wrapped measuring lines 230.

The foldable configuration of the multimeter 210 is advantageous because it allows the multimeter 210 to be stored in less space. Thus, the multieter 210 may be easily stored in a toolbox or the user's pocket. Further, the LCD display 222 and operating knpb/bottons 226, 228 are protected from impact when the multimeter 210 is in the closed position.

It can thus be appreciated that the objectives of the present invention have been fully and effectively accomplished. The foregoing specific embodiments have been provided to illustrate the structural and functional principles of the present invention and is not intended to be limiting. To the contrary, the present invention is intended to encompass all modifications, alterations, and substitutions within the spirit and scope of the appended claims.

What is claimed is:

1. A multimeter comprising:
  a body portion having a face carrying a display and a plurality of input mechanisms;
  a cover pivotally connected to the body portion such that the cover is selectively moveable about a rotational axis between an open position and a closed position; and a probe assembly including a pair of measuring lines connectable to the body portion, wherein the cover includes a magnetic portion on an exterior surface thereof that is configured and positioned to magnetically mount the body portion for use in an inclined relation to a metal surface when the cover is in the open position, and to magnetically mount the body portion to a metal surface when in the closed position; and wherein the body portion includes a narrowed body portion, the cover cooperating with the narrowed body portion so as to define a measuring line receiving space between the face and the cover when the cover is in covering relation to the display and input mechanisms to enable the measuring lines to be wrapped around the narrowed body portion and through the measuring line receiving space between the face and the cover.

2. The multimeter according to claim 1, wherein the cover is capable of retaining an angular relationship relative to the body portion when in the open position thereof so as to present the face of the body portion in an inclined relation relative to a horizontal surface when the cover is placed on the horizontal surface.

3. A multimeter comprising:
a body portion having a face carrying a display and a plurality of input mechanisms;
a probe assembly including a pair of measuring lines connectable to the body portion; and
a cover pivotally connected to the body portion and being movable from a closed position wherein the cover is in covering relation to the display and input mechanisms to an open position wherein the display and input mechanisms are exposed;
the cover being capable of retaining an angular relationship relative to the body portion when in the open position thereof so as to present the face of the body portion in an inclined relation relative to a horizontal surface when the cover is placed on the horizontal surface, wherein the cover includes a magnetic portion on an exterior surface thereof that is configured and positioned to magnetically mount the body portion for use in an inclined relation to a metal surface when the cover is in the open position, and to magnetically mount the body portion to a metal surface when in the closed position.

4. A multimeter comprising:
a body portion having a face carrying a display and a plurality of input mechanisms;
a probe assembly including a pair of measuring lines connectable to the body portion; and
a cover pivotally connected to the body portion and being movable from a closed position wherein the cover is in covering relation to the display and input mechanisms to an open position wherein the display and input mechanisms are exposed;
the cover being capable of retaining an angular relationship relative to the body portion when in the open position thereof so as to present the face of the body portion in an inclined relation relative to a horizontal surface when the cover is placed on the horizontal surface, wherein the body portion includes a narrowed body portion, the cover cooperating with the narrowed body portion so as to define a measuring line receiving space between the face and the cover when the cover is in covering relation to the display and input mechanisms to enable the measuring lines to be wrapped around the narrowed body portion and through the measuring line receiving space between the face and the cover.

5. A multimeter comprising:
a body portion having a face carrying a display and a plurality of input mechanisms;
a probe assembly including a pair of measuring lines connectable to the body portion;
a cover pivotally connected to the body portion and being movable from a closed position wherein the cover is in covering relation to the display and input mechanisms to an open position wherein the display and input mechanisms are exposed;
the body portion having a narrowed body portion, the cover cooperating with the narrowed body portion so as to define a measuring line receiving space between the face and the cover when the cover is in covering relation to the display and input mechanisms to enable the measuring lines to be wrapped around the narrowed body portion and through the measuring line receiving space between the face and the cover.

6. The multimeter according to claim 5, wherein the cover includes a magnetic portion on an exterior surface thereof that is configured and positioned to magnetically mount the body portion for use in an inclined relation to a metal surface when the cover is in the open position, and to magnetically mount the body portion to a metal surface when in the closed position.

7. The multimeter according to claim 5, wherein the cover is capable of retaining an angular relationship relative to the body portion when in the open position thereof so as to present the face of the body portion in an inclined relation relative to a horizontal surface when the cover is placed on such horizontal surface.

8. A multimeter comprising:
a first body portion including a multimeter display;
a second body portion pivotally connected to the first body portion, at least one of said first body portion or said second body portion carrying a probe assembly including a pair of measuring lines,
wherein the first body portion and the second body portion are disposed in substantially overlying relationship with one another and cooperate to form a peripheral recess defining a measuring line receiving space for receiving the measuring lines when the first body portion and the second body portion are in a closed position.

9. The multimeter according to claim 8, further comprising an intermediate body portion for pivotally connecting the first body portion to the second body portion such that the first body portion and the second body portion are selectively moveable about first and second rotational axes, respectively, between an open position and the closed position.

10. The multimeter according to claim 9, wherein the intermediate body portion includes operating buttons.

11. The multimeter according to claim 9, wherein the measuring lines are connected to the intermediate body portion.

12. The multimeter according to claim 8, wherein the multimeter display comprises a liquid crystal display.

13. The multimeter according to claim 8, wherein the second body portion includes a rotatable operating knob that is selectively moveable to several positions that correspond to operating ranges.

14. The multimeter according to claim 8, wherein the first body portion includes operating buttons.

15. The multimeter according to claim 8, wherein the first body portion and the second body portion have main body portions thereof made from a plastic material, and wherein peripheral edge portions of the first and second body portions are formed from a higher coefficient of friction material in comparison to the main body portions.

16. The multimeter according to claim 15, wherein the peripheral edge portions formed from the higher coefficient of friction material form opposite sides of the measuring line receiving space.

17. The multimeter according to claim 15, wherein the higher coefficient of friction material is overmolded onto the main body portions.

18. The multimeter according to claim 8, wherein the first body portion and the second body portion have main body portions thereof made from a plastic material, and wherein peripheral edge portions of the first and second body portions are formed from a softer material in comparison to the main body portions.

19. The multimeter according to claim 18, wherein the peripheral edge portions formed from the softer material form opposite sides of the measuring line receiving space.

20. The multimeter according to claim 18, wherein the softer material is overmolded onto the main body portions.

21. A multimeter comprising:
i) a body including:
a first body portion having a face carrying a display and at least one input mechanism;
a second body portion pivotally connected to the first body portion and being movable from a closed position wherein the second body portion is in overlying, covering relation to the display and input mechanisms to an open position wherein the display and at least one input mechanism are exposed; and
ii) a probe assembly including a pair of measuring lines connectable to the body;
the second body portion being capable of retaining an angular relationship relative to the first body portion when in the open position thereof so as to present the face of the first body portion in an inclined relation relative to a horizontal surface when the second body portion is placed on such horizontal surface, wherein the first and second body portions cooperate to define a peripheral groove about the periphery of the body that enables said measuring lines to be wrapped within a peripheral space defined by said groove when the first and second body portion are in the closed position.

22. The multimeter according to claim 21, wherein each of the first and second body portions has a flange, the flanges cooperating to form the groove.

23. A multimeter comprising:
i) a body, including:
a first body portion having a display;
a second body portion having an input mechanism;
said first and second body portions being pivotally movable between a closed position wherein said first body portion and said second body portion overlay one another so that the display and input mechanism are concealed, and an open position wherein said display and input mechanism are exposed; and
ii) a probe assembly, including a pair of measuring lines, connectable to said body;
said body defining a peripheral groove about the periphery of the body that enables said measuring lines to be wrapped within a peripheral space defined by said groove when the first and second body portions are in the closed position.

24. The multimeter according to claim 23, wherein the first and second body portions cooperate to form the groove.

25. The multimeter according to claim 23, wherein each of the first and second body portions has a flange, the flanges cooperating to form the groove.

* * * * *